(12) United States Patent
Tian et al.

(10) Patent No.: US 12,219,834 B2
(45) Date of Patent: Feb. 4, 2025

(54) DISPLAY SUBSTRATE AND PREPARATION METHOD THEREFOR, AND DISPLAY APPARATUS

(71) Applicant: BOE Technology Group Co., Ltd., Beijing (CN)

(72) Inventors: Xueyan Tian, Beijing (CN); Chengjie Qin, Beijing (CN); Jianchao Zhu, Beijing (CN); Dengyun Chen, Beijing (CN); Liangjian Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 496 days.

(21) Appl. No.: 17/763,659

(22) PCT Filed: May 12, 2021

(86) PCT No.: PCT/CN2021/093421
§ 371 (c)(1),
(2) Date: Mar. 25, 2022

(87) PCT Pub. No.: WO2021/238658
PCT Pub. Date: Dec. 2, 2021

(65) Prior Publication Data
US 2022/0336567 A1 Oct. 20, 2022

(30) Foreign Application Priority Data
May 28, 2020 (CN) .......................... 202010466036.4

(51) Int. Cl.
*H01L 27/32* (2006.01)
*H10K 50/86* (2023.01)
(Continued)

(52) U.S. Cl.
CPC ........... *H10K 59/131* (2023.02); *H10K 50/86* (2023.02); *H10K 71/00* (2023.02); *H10K 59/1201* (2023.02)

(58) Field of Classification Search
CPC ............. H10K 59/1201; H10K 59/131; H10K 59/8731; H10K 71/00
See application file for complete search history.

(56) References Cited

U.S. PATENT DOCUMENTS

| 9,245,936 B2 | 1/2016 | Choi et al. |
| 2008/0135515 A1 | 6/2008 | Pu et al. |

(Continued)

FOREIGN PATENT DOCUMENTS

| CN | 101153969 A | 4/2008 |
| CN | 101196658 A | 6/2008 |

(Continued)

OTHER PUBLICATIONS

European Search Report dated Aug. 28, 2023 for European Patent Application No. 21812847.8.

(Continued)

*Primary Examiner* — Jaehwan Oh
(74) *Attorney, Agent, or Firm* — Ling Wu; Stephen Yang; Ling and Yang Intellectual Property

(57) ABSTRACT

A display substrate includes a display region and a binding region located on one side of the display region, the display region includes a display structure layer, a protective layer provided on the display structure layer and a reflective layer provided on the protective layer, and the display structure layer includes a drive structure layer, a light-emitting structure layer and an encapsulating structure layer stacked on a base; the binding region includes a binding structure layer, a protective layer provided on the binding structure layer at one side of the binding region close to the display region, (Continued)

and a reflective layer provided on the protective layer, and the binding structure layer includes a lead wire structure layer provided on the base, a binding pad provided on the lead wire structure layer and an inorganic encapsulating layer.

17 Claims, 3 Drawing Sheets

(51) Int. Cl.
  *H10K 59/131* (2023.01)
  *H10K 71/00* (2023.01)
  *H10K 59/12* (2023.01)

(56) References Cited

U.S. PATENT DOCUMENTS

| | | |
|---|---|---|
| 2011/0234509 A1 | 9/2011 | Lee et al. |
| 2014/0332765 A1 | 11/2014 | Kim |
| 2017/0069808 A1 | 3/2017 | Kim et al. |
| 2017/0104182 A1 | 4/2017 | Kim et al. |
| 2017/0154943 A1 | 6/2017 | Yang et al. |
| 2017/0221982 A1 | 8/2017 | Park |
| 2019/0196290 A1 | 6/2019 | Shih et al. |
| 2020/0211477 A1* | 7/2020 | Lai .................. G09G 3/3258 |
| 2021/0376290 A1 | 12/2021 | Zhang et al. |
| 2022/0114355 A1 | 4/2022 | Xia et al. |

FOREIGN PATENT DOCUMENTS

| | | |
|---|---|---|
| CN | 104465713 A | 3/2015 |
| CN | 104867450 A | 8/2015 |
| CN | 106444135 A | 2/2017 |
| CN | 107026245 A | 8/2017 |
| CN | 107123664 A | 9/2017 |
| CN | 108319090 A | 7/2018 |
| CN | 108538894 A | 9/2018 |
| CN | 108878480 A | 11/2018 |
| CN | 110164916 A | 8/2019 |
| CN | 110335953 A | 10/2019 |
| CN | 110767841 A | 2/2020 |
| CN | 110828695 A | 2/2020 |
| CN | 110838509 A | 2/2020 |
| CN | 110838559 A | 2/2020 |
| CN | 110931540 A | 3/2020 |
| CN | 110993806 A | 4/2020 |
| CN | 111200082 A | 5/2020 |
| CN | 111584603 A | 8/2020 |
| CN | 112186019 A | 1/2021 |
| CN | 112216732 A | 1/2021 |

OTHER PUBLICATIONS

The First Office Action dated Jul. 8, 2022 for Chinese Patent Application No. 202010466036.4 and English Translation.
The First Office Action dated Mar. 2, 2022 for Chinese Patent Application No. 202011062894.9 and English Translation.
Notification to Go Through Registration Formalities dated Jul. 27, 2022 for Chinese Patent Application No. 202011062894.9 and English Translation.
The First Office Action dated Jun. 13, 2022 for Chinese Patent Application No. 202180000479.7 and English Translation.
International Search Report for PCT/CN2021/080865 Mailed Jun. 23, 2021.
International Search Report for PCT/CN2021/093421 Mailed Aug. 10, 2021.

* cited by examiner

DISPLAY SUBSTRATE AND PREPARATION METHOD THEREFOR, AND DISPLAY APPARATUS

CROSS-REFERENCE TO RELATED APPLICATION

This application is a national stage application of PCT Application No. PCT/CN2021/093421, which is filed on May 12, 2021 and claims priority to Chinese Patent Application No. 202010466036.4 entitled "Display Substrate and Preparation Method Therefor, and Display Apparatus" and filed on May 28, 2020 in the China Patent Office, the contents of which should be interpreted as being incorporated herein by reference.

TECHNICAL FIELD

The present disclosure relates to, but is not limited to, the field of display technology, and more particularly, to a display substrate, a preparation method thereof, and a display apparatus.

BACKGROUND

A display substrate of an Organic Light Emitting Diode (OLED) is applied extensively in the display field of mobile phones, tablet computers, digital cameras and the like by virtue of its advantages of low energy consumption, low production cost, auto-luminescence, wide angle of view, high response speed, etc.

With the rapid development of display technologies, various novel technologies continue to emerge, and possessing a multifunctional display apparatus has become one of the goals pursued by people. At present, mirror display apparatuses on the market may realize both a display function and a mirror function, and thus are applied extensively. Mirror display means that a user may view a display image in a display of a mirror while using the mirror, thereby meeting various requirements of people in various fields, such as an advertising display screen in a public place, a car rearview mirror, a display screen of an Automatic Teller Machine (ATM), etc.

A reflective layer disposed on an encapsulating structure layer is used in some mirror display substrates to reflect light to function as a mirror. Patterning processes are needed to be performed during manufacturing of the reflective layer to form light-transmitting holes in the reflective layer, which correspond to light emitting units in a display region. In some technologies, in order to prevent the etching risk existing in the patterning processes of manufacturing the reflective layer, a protective layer is arranged between the encapsulating structure layer and the reflective layer, but the process of manufacturing the protective layer is complicated.

SUMMARY

The following is a summary about the subject matter described herein in detail. The summary is not intended to limit the protection scope of the claims.

A embodiment of the present disclosure provides a display substrate, which includes a display region and a binding region located on one side of the display region, wherein the display region includes a display structure layer, a protective layer provided on the display structure layer and a reflective layer provided on the protective layer, and the display structure layer includes a drive structure layer, a light-emitting structure layer and an encapsulating structure layer stacked on a base; the binding region includes a binding structure layer, a protective layer provided on the binding structure layer at one side of the binding region close to the display region, and a reflective layer provided on the protective layer, and the binding structure layer includes a lead wire structure layer provided on the base, a binding pad provided on the lead wire structure layer and an inorganic encapsulating layer; the protective layer is formed using a first open mask and a first opening is provided in the protective layer, the first opening being located on one side of the binding region away from the display region and the first opening exposing the binding pad.

An embodiment of the present disclosure further provides a display apparatus including the display substrate described above.

An embodiment of the present disclosure further provides a method of manufacturing a display substrate, which includes a display region and a binding region located on one side of the display region, wherein the method includes:

forming a display structure layer and a binding structure layer in the display region and the binding region respectively, wherein the display structure layer includes a drive structure layer, a light-emitting structure layer and an encapsulating structure layer stacked on a base, and the binding structure layer includes a lead wire structure layer provided on the base, a binding pad provided on the lead wire structure layer and an inorganic encapsulating layer;

forming a protective layer, in which a first opening is provided, using a first open mask, wherein the protective layer overlies the display structure layer in the display region and overlies the binding structure layer at one side of the binding region close to the display region, the first opening is located on one side of the binding region away from the display region, and the first opening exposes the binding pad; and forming a reflective layer on the protective layer.

After the drawings and the detailed description are read and understood, the other aspects may become clear.

BRIEF DESCRIPTION OF DRAWINGS

The drawings are intended to provide a further understanding of technical schemes of the present disclosure and form a part of the specification, and are used to explain the technical schemes of the present disclosure together with the embodiments of the present disclosure, and not intended to form limitations to the technical schemes of the present disclosure. The shapes and sizes of various components in the drawings do not reflect the true proportion, and are only intended to schematically illustrate the contents of the present disclosure.

DETAILED DESCRIPTION

Figure 1:
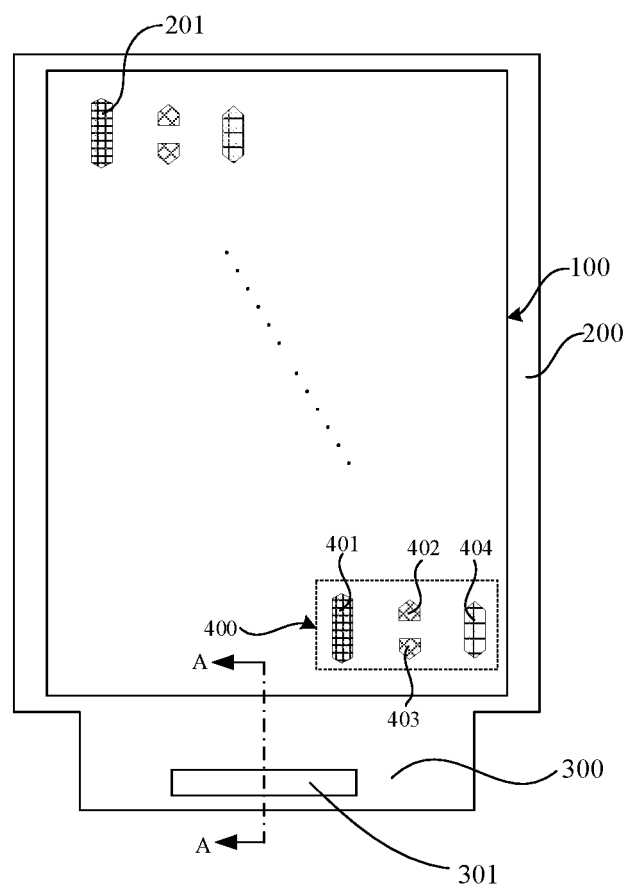
FIG. 1 is a schematic top view of a display substrate in accordance with an exemplary embodiment of the present disclosure.

Those of ordinary skill in the art should understand that modifications or equivalent substitutions that can be made to the technical schemes of the present disclosure without departing from the spirit and scope of the technical schemes of the present disclosure should fall within the scope of the claims of the present disclosure.

Sometimes for the sake of clarity, sizes of various constituent elements, thicknesses of layers or areas in the drawings may be exaggerated. Therefore, embodiments of the present disclosure are not necessarily limited to the sizes, and the shapes and sizes of various components in the drawings do not reflect the true proportion. In addition, the drawings schematically illustrate ideal examples, and the embodiments of the present disclosure are not limited to the shapes or numerical values shown in the drawings.

Unless otherwise specified and defined explicitly, the terms "connection", "fixed connection", "installation" and "assembly" should be understood in a broad sense in the description herein, and, for example, may be a fixed connection, a detachable connection or an integrated connection; the terms "connection", "fixed connection" and "installation" may be a direct connection, an indirect connection through intermediate components, or communication inside two components. For those ordinarily skilled in the art, the meanings of the above terms in the embodiments of the present disclosure can be understood according to specific situations.

FIG. 1 is a schematic top view of a display substrate in accordance with an exemplary embodiment of the present disclosure. As shown in FIG. 1, the display substrate includes a display region 100 and a binding region 300 located on one side of the display region 100. The binding region 300 includes a binding pad 301, which is configured to be in binding connections with an external flexible printed circuit (FPC) and a driving integrated circuit (driving IC for short). The display region 100 includes a plurality of pixel units 400 arranged in an array. Each of the pixel units 400 includes a plurality of light emitting units. The pixel units 400 can be referred to as pixel points, and each of the pixel units 400 can display many different colors. In some examples, the light emitting units are OLED light emitting units. One light emitting unit may include an anode, an organic light emitting layer and a cathode. In some exemplary embodiments, the pixel unit 400 includes a first light emitting unit 401, a second light emitting unit 402, a third light emitting unit 403 and a fourth light emitting unit 404. In some exemplary embodiments, the first light emitting unit 401 is configured to be a red light emitting unit, both the second light emitting unit 402 and the third light emitting unit 403 may be configured to be green light emitting units, and the fourth light emitting unit 404 may be configured to be a blue light emitting unit. In other examples, the pixel unit 400 may include three light emitting units, i.e., a red light emitting unit, a green light emitting unit and a blue light emitting unit, respectively. In other examples, the display substrate may be a white OLED display substrate. In some examples herein, any one of the light emitting units in the display region 100 can be collectively referred to as a light emitting unit 201. In some examples herein, the shape of the light emitting unit may not be limited, for example, it may be a rectangle, a hexagon, etc. Manners of arranging the light emitting units may not be limited.

Figure 2:
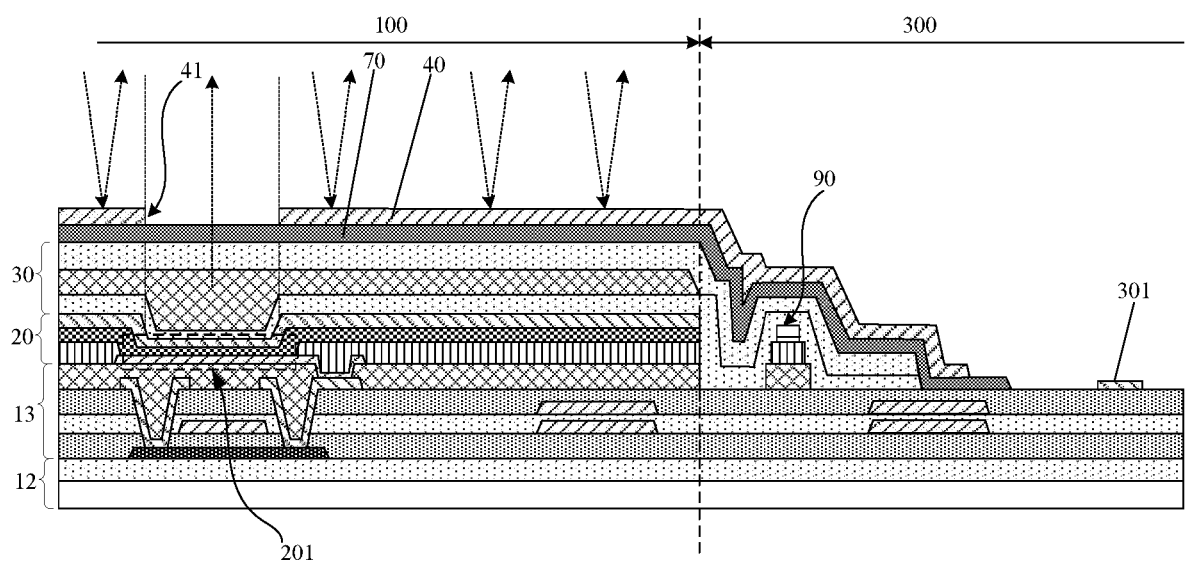
FIG. 2 is a schematic structure diagram of an A-A section of the display substrate shown in FIG. 1 in some exemplary embodiments.

As shown in FIG. 2, which shows a schematic structure diagram of an A-A section of the display substrate shown in FIG. 2 in an exemplary embodiment. The display region 100 includes a display structure layer, a protective layer 70 provided on the display structure layer, and a reflective layer 40 provided on the protective layer 70, and the display structure layer includes a drive structure layer 13, a light-emitting structure layer 20 and an encapsulating structure layer 30 stacked on a base 12; the binding region 300 includes a binding structure layer, a protective layer 70 provided on the binding structure layer at one side of the binding region 300 close to the display region 100, and a reflective layer 40 provided on the protective layer 70, and the binding structure layer includes a lead wire structure layer provided on the base 12, a binding pad 301 provided on the lead wire structure layer and an inorganic encapsulating layer; the protective layer 70 is formed using a first open mask and a first opening is provided in the protective layer 70, the first opening being located on one side of the binding region 300 away from the display region 100 and the first opening exposing the binding pad 301. A pixel driving circuit, which includes at least one thin film transistor and a storage capacitor, is provided inside the drive structure layer 13. The light-emitting structure layer 20 includes a plurality of light emitting units 201, which are connected to the pixel driving circuit. A thin film transistor and a light emitting unit 201 in the display region 100 is illustrated in FIG. 2 by way of examples.

In an embodiment of the present disclosure, the first opening in the protective layer 70 refers to a portion of the protective layer 70 in the binding region 300, which does not cover the binding region 300, and the function of the first opening is to expose the binding pad 301. In some examples, the first opening may be a groove structure formed by the irregular edge of the protective layer 70.

In some exemplary embodiments, the lead wire structure layer includes a second metal layer disposed inside the lead wire structure layer and away from the base 12, the second metal layer includes a second lead, and an orthographic projection of the protective layer 70 on the base 12 contains an orthographic projection of the second lead on the base 12. Thus, the lead wire structure layer will not be etched by the patterning processes in the subsequent process of manufacturing the reflective layer 40, thereby reducing the risk of exposure of the second lead, which is away from the base 12, inside the lead wire structure layer.

In some exemplary embodiments, a material of the protective layer 70 may be silicon nitride (SiNx), silicon oxide (SiOx) or a composite material of SiNx/SiOx. In some exemplary embodiments, the material of the protective layer 70 is SiNx. The thickness of the protective layer 70 may be 0.2 μm to 0.4 μm. For example, the thickness of the protective layer 70 may be 0.3 μm.

In some exemplary embodiments, as shown in FIG. 2, the binding structure layer further includes an isolation dam 90 disposed on the lead wire structure layer. The isolation dam 90 is wrapped by the inorganic encapsulating layer. The isolation dam 90 is located in the binding region 300, so as to prevent external water vapor from entering the display region 100, thereby reducing the risk of invasion of water vapor to the light emitting units 201 in the display region 100.

In some exemplary embodiments, the display substrate further includes an optical adhesive layer and a cover plate. The cover plate is attached to one side of the reflective layer 40 away from the base 12 through the optical adhesive layer.

In some exemplary embodiments, light-transmitting holes 41 corresponding to the light emitting units 201 one by one are provided in the reflective layer 40, and light emitted by the light emitting units 201 can exit through the light-transmitting holes 41, thereby improving the light transmittance of the display apparatus. In addition, in a non-light emitting area of the display region 100, the external light is reflected after it hits the reflective layer 40, thereby implementing the function of a mirror. Therefore, the display substrate is a mirror display substrate having both display and mirror functions. In addition, since the external light does not pass through the reflective layer 40, the light emitted by the light emitting units 201 will not be affected by the external light, thereby improving the display contrast of the display apparatus. An exposure hole located in the binding region 300 is also provided in the reflective layer 40. The exposure hole exposes the binding pad 301, so as to facilitate the binding connections of the binding pad 301 with the driving IC and a flexible circuit board.

In some exemplary embodiments, as shown in FIG. 2, the base 12 serves as a carrier of the display substrate. The base 12 may include a composite substratum and a buffer layer disposed on the composite substratum. The composite substratum may be a flexible substratum or a rigid substratum. The composite substratum may include a first substratum, a second substratum and a third substratum which are sequentially stacked, and the buffer layer is disposed on the third substratum and faces to the drive structure layer 13. In other exemplary embodiments, the base 12 may include one or two layers of substratums. Illustratively, the first substratum, the second substratum and the third substratum each may be made of pressure sensitive adhesive (PSA), polyimide (PI), polyethylene terephthalate (PET) or surface treated polymer soft films. In some exemplary embodiments, a material of the first substratum 121 is pressure sensitive adhesive, and materials of both the second substratum 122 and the third substratum 123 are polyimide. The buffer layer may be made of silicon nitride (SiNx), silicon oxide (SiOx) or a composite material of SiNx/SiOx. In some exemplary embodiments, the drive structure layer 13 is disposed on the buffer layer of the base 12.

The method of manufacturing the display substrate in accordance with the embodiments of the present disclosure will be described in conjunction with the structure of the display substrate of FIG. 2. In order to describe the number of runnings of a masking process of the display substrate in detail, "patterning processes" are used hereinafter to represent processes in which patterns are formed every time. Each running of the patterning processes corresponds to one running of the masking process. The "patterning processes" may include photoresist coating, mask exposure, development, etching, photoresist stripping, etc., for inorganic materials (e.g., metal layers, inorganic layers, etc.), and include mask exposure, development, etc., for organic materials (e.g., photoresists, organic resins, etc.). Deposition may be any one or more of sputtering, evaporation and chemical vapor deposition, coating may be any one or more of spray coating, spin coating and inkjet printing, and etching may be any one or more of dry etching and wet etching. "Film" refers to a layer of film formed by a certain material on a base using deposition, coating or other processes. If the "film" does not need the patterning processes in the entire manufacturing process, the "film" may also be called a "layer". If the "film" needs the patterning processes in the entire manufacturing process, the "film" is called a "film" before the patterning processes are performed and is called a "layer" after the patterning processes are performed. The "layer" processed by the patterning processes includes at least one "pattern". "A and B are disposed on the same layer" in the present disclosure means that A and B are formed simultaneously through the same running of the patterning processes, and the "thickness" of the film layer is the dimension of the film layer in a direction perpendicular to the substrate.

Figure 3:
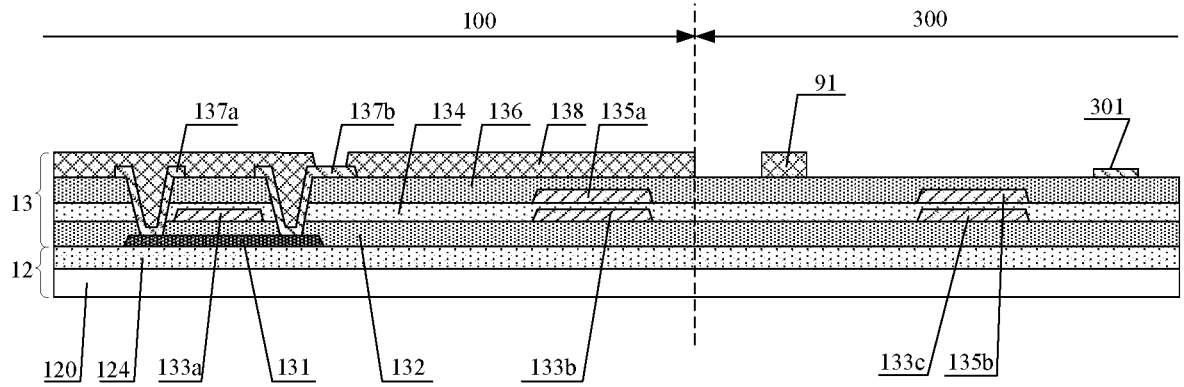
FIG. 3 is a schematic cross-sectional view of the display substrate of FIG. 2 after a drive structure layer in a display region and a lead wire structure layer and a binding pad in a binding region are formed.

(1) The drive structure layer 13 in the display region 100 and the lead wire structure layer and the binding pad 301 in the binding region 300 are formed on the base 12. As shown in FIG. 3, this step may include the following processes.

In the first patterning process, an active layer 131 is formed on the buffer layer 124 of the base 12 (including a composite substratum 120 and the buffer layer 124 provided on the composite substratum 120), the active layer 131 being located in the display region 100. This step may include: depositing an active film on the buffer layer 124, and patterning the active film through the patterning processes to form the active layer 131, as shown in FIG. 3. In some exemplary embodiments, a material of the active film may be a low temperature poly-silicon (LPTS) or microcrystalline silicon material, or may be a metal oxide material, which may be indium gallium zinc oxide (IGZO) or indium tin zinc oxide (ITZO).

In the second patterning process, a first metal layer is formed at one side of the active layer 131 away from the base 12. This step may include: depositing a first insulating film at the side of the active layer 131 away from the base 12 to form a first insulating layer 132, which is located in the display region 100 and the binding region 300; depositing a first metal film at one side of the first insulating layer 132 away from the base 12, and patterning the first metal film through the patterning processes to form the first metal layer. The first meta layer includes a gate electrode 133a, a first capacitor electrode 133b and a gate line (not shown in the figure), which are located in the display region 100, and a first lead 133c which is located in the binding region 300. In some exemplary embodiments, the first metal film may be made of one or more of metals such as platinum (Pt), ruthenium (Ru), aurum (Au), argentum (Ag), molybdenum (Mo), chromium (Cr), aluminum (Al), tantalum (Ta), titanium (Ti), wolfram (W), etc. The first insulating film may be made of silicon nitride (SiNx), silicon oxide (SiOx) or a composite layer of SiNx/SiOx.

In the third patterning process, a second metal layer is formed at one side of the first metal layer away from the base 12. This step may include: depositing a second insulating film at the side of the first metal layer away from the base 12 to form a second insulating layer 134, which is located in the display region 100 and the binding region 300, depositing a second metal film at one side of the second insulating layer 134 away from the base 12, and patterning the second metal film through the patterning processes to form a second metal layer, which includes a second capacitor electrode 135a located in the display region 100 and a second lead 135b located in the binding region 300, as shown in FIG. 3. The second capacitor electrode 135a corresponds to the first capacitor electrode 133b, and the second capacitor electrode 135a and the first capacitor electrode 133b form two polar plates of the storage capacitor. In some exemplary embodiments, the second metal film may be made of one or more of metals such as platinum (Pt), ruthenium (Ru), aurum (Au), argentum (Ag), molybdenum (Mo), chromium (Cr), aluminum (Al), tantalum (Ta), titanium (Ti), wolfram (W), etc. The second insulating film may be made of silicon nitride (SiNx), silicon oxide (SiOx) and a composite layer of SiNx/SiOx.

Figure 4:
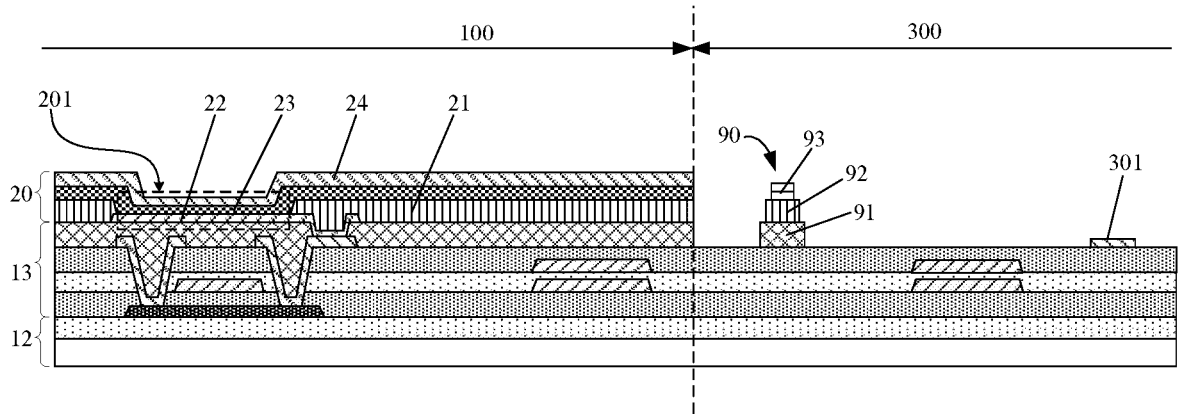
FIG. 4 is a schematic cross-sectional view of the display substrate of FIG. 2 after a light-emitting structure layer and a photo spacer are formed.

In the fourth patterning process, a third insulating layer 136 is formed at one side of the second metal layer away from the base 12, the third insulating layer 136 being located in the display region 100 and the binding region 300. First and second via holes penetrating through the third insulating layer 136, the second insulating layer 134 and the first insulating layer 132 are provided in the third insulating layer 136. The first via hole exposes one end of the active layer 131, and the second via hole exposes the other end of the active layer 131. This step may include: depositing a third insulating film at one side of the second metal layer away from the base 12, and patterning the third insulating film, the second insulating layer 134 and the first insulating layer 132 through the patterning processes to form the first and second via holes. The first via hole exposes one end of the active layer 131, and the second via hole exposes the other end of the active layer 131, so that the third insulating layer 136 is formed, as shown in FIG. 4. In some exemplary embodiments, the third insulating film may be made of silicon nitride (SiNx), silicon oxide (SiOx) or a composite layer of SiNx/SiOx.

In the fifth patterning process, a third metal layer is formed at one side of the third insulating layer 136 away from the base 12. The third metal layer includes a source electrode 137a, a drain electrode 137b and a data line (not shown), which are located in the display region 100, and the binding pad 301 located in the binding region 300. The source electrode 137a is connected to one end of the active layer 131 through the first via hole, and the drain electrode 137b is connected to the other end of the active layer 131 through the second via hole. This step may include: depositing a third metal film at the side of the third insulating layer 136 away from the base 12, and patterning the third metal film through the patterning processes to form a third metal layer.

In the sixth patterning process, a fourth insulating layer 138 is formed at one side of the third metal layer away from the base 12, and a third via hole exposing the drain electrode 137b is provided in the fourth insulating layer 138, which includes a first dam base 91 located in the binding region 300. This step may include: coating a fourth insulating film at one side of the third metal layer away from the base 12, and patterning the fourth insulating film through the patterning processes to form a fourth insulating layer 138. So far, the manufacturing of the drive structure layer 13 in the display region 100 and the lead wire structure layer and the binding pad 301 in the binding region 300 have been completed, as shown in FIG. 3. In some exemplary embodiments, a material of the fourth insulating layer 138 is an organic material, such as a photoresist, a resin material, etc. The fourth insulating layer 138 is also referred to as a planarization layer. A surface of the fourth insulating layer 138 at one side away from the base 12 is a flat surface.

(2) The light-emitting structure layer 20 is formed at one side of the drive structure layer 13 in the display region 100 away from the base 12, and the isolation dam 90 is formed in the binding region 300. As shown in FIG. 4, the light-emitting structure layer 20 includes a first electrode layer (including a plurality of first electrodes 22), a pixel definition layer 21, an organic light emitting layer 23 and a second electrode layer 24, which are located in the display region 100. The light-emitting structure layer 20 includes the plurality of light emitting units 201, each of which including the first electrode 22, the organic light emitting layer 23 and the second electrode layer 24. This step may include the following processes.

In the seventh patterning process, the first electrode layer is formed at one side of the fourth insulating layer 138 in the display region 100 away from the base 12. The first electrode layer includes the plurality of first electrodes 22. This step may include: depositing a first conductive film at one side of the fourth insulating layer 138 away from the base 12, and patterning the first conductive film through the patterning processes to form the first electrode layer including the plurality of first electrodes 22. Each of the first electrodes 22 is located in an area where a light emitting unit 201 is located, and the first electrode 22 is connected to the drain electrode 137b through the third via hole provided in the fourth insulating layer 138, as shown in FIG. 4. The first conductive thin film may be made of a commonly used material in the art, such as indium tin oxide (ITO), indium zinc oxide (IZO) or a multilayer composite material of ITO/aluminum (Al)/ITO, which is not limited herein. The first electrodes 22 may be anodes of the light emitting units of the OLED.

In the eighth patterning process, the pixel definition layer 21 is formed at one side of the first electrode layer in the display region 100 away from the base 12, and a second dam base 92 located on the first dam base 91 is formed in the binding region 300. A pixel opening, located in an area where each of the light emitting units 201 is located, is provided in the pixel definition layer 22, and the first electrode 22 is exposed through the pixel opening. This step may include: forming a pixel definition film on surfaces of all the forementioned structures, and patterning the pixel definition film through the patterning processes to forming the pixel definition layer 21 and the second dam base 92, as shown in FIG. 4. In some exemplary embodiments, the pixel definition layer may be made of a material such as polyimide, acrylic or polyethylene terephthalate.

In the ninth patterning process, a photo spacer (PS) 93 is formed. This step may include: coating an organic material film on the surfaces of all the forementioned structures of the display substrate, and forming the photo spacer (PS) 93 through mask, exposure and development processes. The photo spacer (PS) 93 can be formed on the second dam base 92 in the binding region 300, so as to form the isolation dam 90 (including the first dam base 91, the second dam base 92 and the photo spacer 93).

Subsequently, an organic light emitting material and a second conductive material are deposited sequentially in the display region 100 to form an organic light emitting layer 23 and a second electrode layer 24, respectively. The organic light emitting layer 23 is connected to the first electrode 22 through the pixel opening in the pixel definition layer 22, and the second electrode layer 24 is located on a surface of the organic light emitting layer 23 at one side away from the base 12, as shown in FIG. 4. The organic light emitting layer 23 mainly includes a light emitting layer (EML). The organic light emitting layer 23 may include a hole injection layer, a hole transport layer, a light emitting layer, an electron transport layer and an electron injection layer which are sequentially arranged. In order to improve the efficiency of the electron and hole injection layers and the light emitting layer, the second conductive material may be one or more of metal materials such as magnesium (Mg), argentum (Ag), aluminum (Al), copper (Cu), lithium (Li), etc. The second electrode layer 24 may be cathodes of the light emitting units 201. The cathodes of all the light emitting units are an integrated structure, i.e., the second electrode layer 24 is an integrated structure.

Figure 5:
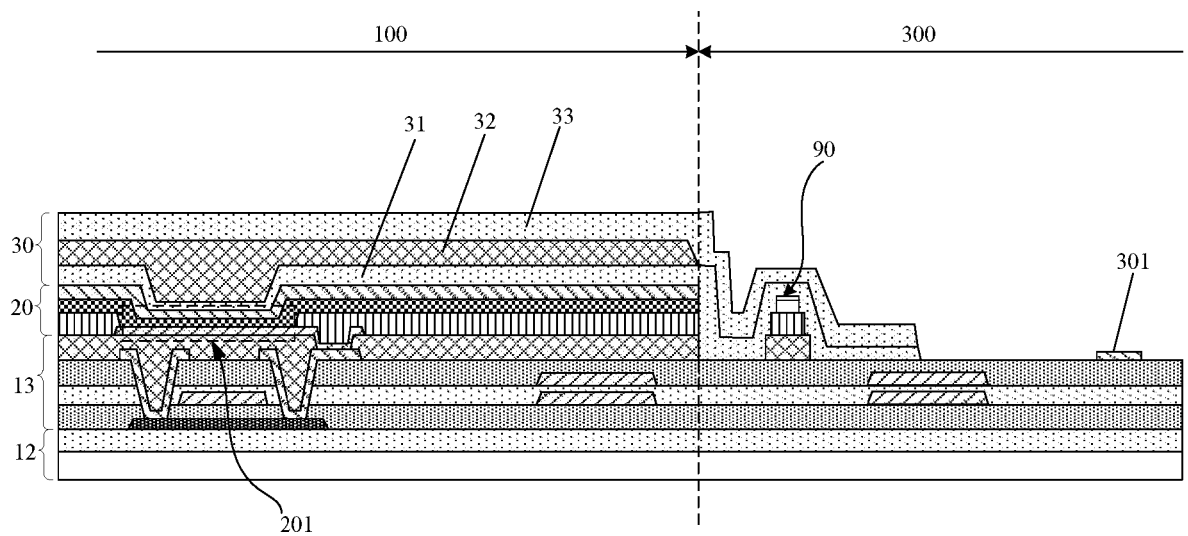
FIG. 5 is a schematic cross-sectional view of the display substrate of FIG. 2 after an encapsulating structure layer and an inorganic encapsulating layer are formed.

(3) An encapsulating structure layer 30 is formed on the light-emitting structure layer 20 in the display region 100, and the inorganic encapsulating layer is formed in an area of the binding region 300 close to the display region 100, as shown in FIG. 5. The encapsulating layer 30 includes a first inorganic encapsulating layer 31, an organic encapsulating layer 32 and a second inorganic encapsulating layer 33 that are stacked sequentially. Orthographic projections of the first inorganic encapsulating layer 31, the organic encapsulating layer 32 and the second inorganic encapsulating layer 33 on the base 12 all include the display region 100. In some exemplary embodiments, both the first inorganic encapsulating layer 31 and the second inorganic encapsulating layer 33 are located in the display region 100, a border region 200 and the binding region 300, and the organic encapsulating layer 32 is located in the display region 100. The inorganic encapsulating layer includes the stacked first inorganic encapsulating layer 31 and second inorganic encapsulating layer 33, which are located in the border region 200 and the binding region 300. This step may include the following step.

The first inorganic encapsulating layer 31 is formed in the display region 100, the border region 200 and the binding region 300. This step may include: depositing a first inorganic encapsulating film in the entire display region 100, an area of the border region 200 close to the display region 100 and the area of the binding region 300 close to the display region 100 using a second open mask to form the first inorganic encapsulating layer 31, in which a second opening exposing the binding pad 301 is provided. The second open mask covers the binding pad 301 during the deposition of the first inorganic encapsulating film, and a portion of the second open mask covering the binding pad 301 is used to form the second opening of the first inorganic encapsulating layer 31. In some exemplary embodiments, the first inorganic encapsulating film may be made of silicon nitride (SiNx), silicon oxide (SiOx) or a composite layer of SiNx/SiOx. In some exemplary embodiments, the first inorganic encapsulating film is made of silicon oxynitride (SiON).

The organic encapsulating layer 32 is formed on the first inorganic encapsulating layer 31 in the display region 100. This step may include: an organic encapsulating material is inkjet-printed onto the first inorganic encapsulating layer 31 in the display region 100 using an inkjet printing process, and then is cured to form the organic encapsulating layer 32.

The second inorganic encapsulating layer 33 is formed in the display region 100, the border region 200 and the binding region 300. This step may include: depositing a second inorganic encapsulating film in the entire display region 100, the area of the border region 200 close to the display region 100 and the area of the binding region 300 close to the display region 100 using a third open mask to form the second inorganic encapsulating layer 33, in which a third opening exposing the binding pad 301 is provided. The third open mask covers the binding pad 301 during the deposition of the second inorganic encapsulating film, and a portion of the third open mask covering the binding pad 301 is used to form the third opening in the second inorganic encapsulating layer 33. The third open mask may be the same as the second open mask. In some exemplary embodiments, the second inorganic encapsulating film may be made of silicon nitride (SiNx), silicon oxide (SiOx) and a composite layer of SiNx/SiOx. In some exemplary embodiments, the second inorganic encapsulating film is made of silicon nitride (SiNx). It can be known from the above processes that the inorganic encapsulating layer includes the first inorganic encapsulating layer 31 and the second inorganic encapsulating layer 33 which are stacked, the inorganic encapsulating layer being formed in both the area of the border region 200 close to the display region 100 and the area of the binding region 300 close to the display region 100.

In some exemplary embodiments, the thickness of the first inorganic encapsulating layer 31 may be 1 μm, the thickness of the organic encapsulating layer 32 may be 12 μm, and the thickness of the second inorganic encapsulating layer 33 may be 500 nm to 700 nm (e.g., 600 nm).

Figure 6A:
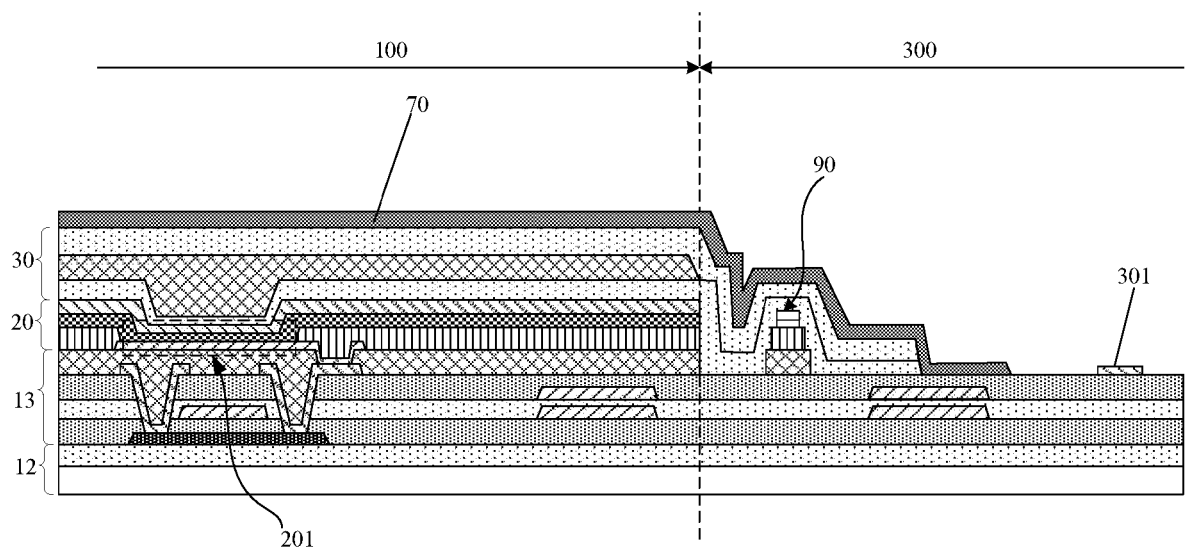
FIG. 6a is a schematic cross-sectional view of the display substrate of FIG. 2 after a protective layer is formed.
Figure 6B:
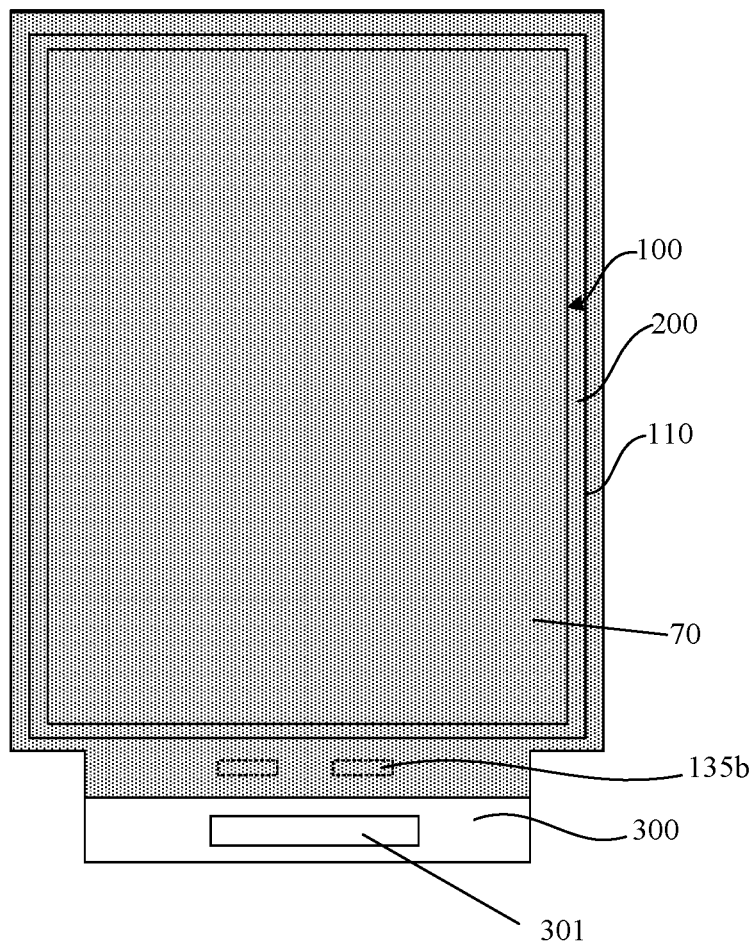
FIG. 6b is a schematic top view of the display substrate of FIG. 2 after a reflective layer is formed.

(4) A protective layer 70 is formed in the display region 100, the area of the border region 200 close to the display region 100 and the area of the binding region 300 close to the display region 100, as shown in FIGS. 6a and 6b. This step may include the following step.

A protective film is deposited in predetermined areas of the surfaces of all the forementioned structures of the display substrate using a first open mask. The predetermined areas may include the entire display region 100, the entire border region 200 and the area of the binding region 300 close to the display region 100. The predetermined areas can be determined by a position of an opening portion of the first open mask on the display substrate. During the deposition of the protective film, an obscured portion of the first open mask covers the binding pad 301 (the obscured portion of the first open mask is used to form the first opening in the protective layer 70), and then the protective film is deposited on the encapsulating structure layer 30 in the display region 100, the inorganic encapsulating layer in the border region 200 and the binding region 300, and the lead wire structure layer outside the edge of the inorganic encapsulating layer in the binding region 300, so as to form the protective layer 70, in which the first opening exposing the binding pad 301 is provided, as shown in FIGS. 6a and 6b.

In some exemplary embodiments, as shown in FIGS. 6a and 6b, the orthographic projection of the protective layer 70 on the base 12 contains an orthographic projection of the second lead 135b (shown in FIG. 3) on the base 12. Thus, the lead wire structure layer will not be etched by the patterning processes in the subsequent process of manufacturing the reflective layer 40, thereby reducing the risk of exposure of the second lead 135b of the second metal layer, which is away from the base 12, inside the lead wire structure layer.

In some exemplary embodiments, a material of the protective layer 70 may be silicon nitride (SiNx), silicon oxide (SiOx) or a composite layer of SiNx/SiOx. In some exemplary embodiments, the material of the protective layer 70 is SiNx. The thickness of the protective layer 70 may be 0.2 μm to 0.4 μm. For example, the thickness of the protective layer 70 may be 0.2 μm, 0.3 μm or 0.4 μm.

In some technologies, in order to avoid the etching risk existing in the patterning processes of manufacturing the reflective layer (that is, overetching occurs easily in the etching process to cause the lead wire structure layer to be etched, resulting in the risk of exposure of leads inside the lead wire structure layer), the protective layer is arranged between the encapsulating structure layer and the reflective layer. The process of forming the protective layer is as follows: depositing firstly a protective film on the entire surface of the display substrate, and then forming an exposure hole exposing the binding pad on the protective film using the patterning processes. The processes in this method are complicated, and the exposure process is needed in the patterning processes, and a specific mask needs to be used in the exposure process, thereby complicating the processes and increasing the production cost. However, in the embodiments of the present disclosure, since the protective layer 70 is directly deposited in the predetermined areas using the open mask, compared with the methods of manufacturing the protective layer in some of the above technologies, the patterning processes do not need to be performed, the processes are simple, the specific mask used in the exposure process of the patterning processes can also be saved, and the cost is saved, resulting in greater mass production in the actual production.

In some exemplary embodiments, the orthographic projection of the protective layer 70 on the base 12 also contains orthographic projections of the encapsulating structure layer 30 and the inorganic encapsulating layer on the base 12. As shown in FIG. 6b, the edges of the encapsulating structure layer 30 and the inorganic encapsulating layer, i.e., the encapsulating edge 110. The encapsulating edge 110 are covered by the protective layer 70 (the filled area represents the protective layer 70).

(5) In the tenth patterning process, the reflective layer 40 is formed on the surfaces of all the forementioned structures of the display substrate. The light-transmitting holes 41 corresponding to the light emitting units 201 one by one are provided in the reflective layer 40, and the exposure hole exposing the binding pad 301 is also provided in the reflective layer 40, to facilitate the binding connections of the binding pad 301 with the external driving IC and the flexible circuit board, as shown in FIG. 2. This step may include: depositing a reflective film on the surfaces of all the forementioned structures of the display substrate, and patterning the reflective film through the patterning processes to form the light-transmitting holes 41 and the exposure hole exposing the binding pad 301, so as to form the reflective layer 40.

In some exemplary embodiments, the area of all the light-transmitting holes 41 in the reflective layer 40 is 10% to 40% of the area of the display region of the display substrate, that is, the area of an orthographic projection of the reflective layer 40 on a plane parallel to the display substrate is 60% to 90% of the area 100 of the display region of the display substrate. The area of the light-transmitting hole 41 and the area of the light emitting unit 201 (the area of the light emitting unit 201 is the area of an orthographic projection of the light emitting unit 201 on the base or the area of the pixel opening in the pixel definition layer 21 corresponding to the light emitting unit 201) are not limited in size. The area of the light-transmitting hole 41 may be greater than, lesser than or equal to the area of the light emitting unit 201. Increasing of the area of the light-transmitting hole 41 will reduce the mirror effect, but the brightness of the display substrate will be improved; decreasing of the area of the light-transmitting hole 41 will enhance the mirror effect, but the brightness of the display substrate will be reduced. The shape of the light-transmitting hole 41 is not limited herein, and may be set to be a square, a circle, etc., according to actual needs. The shape of the light-transmitting hole 41 may be the same as that of the light emitting unit 201.

In some exemplary embodiments, materials of the reflective layer 40 may include one or more of molybdenum (Mo), aluminum (Al), argentum (Ag), titanium (Ti), an ITO/Ag/ITO multilayer composite material and a Ti/Al/Ti multilayer composite material. In some exemplary embodiments, the thickness of the reflective layer may be 0.25 µm to 0.4 µm. In some exemplary embodiments, the material of the reflective layer is aluminum, and its thickness is 0.33 µm.

Subsequently, the optical adhesive layer and the cover plate can be attached to the side of the reflective layer 40 away from the base 12. This step may include: attaching the optical adhesive layer to the surface of the reflective layer 40 away from the base 12, and attaching the cover plate to one side of the optical adhesive layer away from the base 12 using an attaching process.

An embodiment of the present disclosure provides a method of manufacturing a display substrate including a display region and a binding region located on one side of the display region according to the forementioned process of manufacturing the display substrate, wherein the method includes:

forming a display structure layer and a binding structure layer in the display region and the binding region respectively, wherein the display structure layer includes a drive structure layer, a light-emitting structure layer and an encapsulating structure layer stacked on a base, and the binding structure layer includes a lead wire structure layer provided on the base, a binding pad provided on the lead wire structure layer and an inorganic encapsulating layer;

forming a protective layer, in which a first opening is provided, using a first open mask, wherein the protective layer overlies the display structure layer in the display region and overlies the binding structure layer at one side of the binding region close to the display region, the first opening is located on one side of the binding region away from the display region, and the first opening exposes the binding pad; and forming a reflective layer on the protective layer.

In the method of manufacturing the display substrate in accordance with the embodiment of the present disclosure, the protective layer is formed by directly depositing the protective film using the open mask, thus the patterning processes do not need to be performed in the process of manufacturing the protective layer to form the exposure hole exposing the binding pad. Compared with the method of depositing the protective film on the whole surface of the display substrate and then patterning the protective film to form the protective layer in some technologies, this process is simple and the cost is saved, resulting in greater mass production in the actual production.

In some exemplary embodiments, the lead wire structure layer includes a second metal layer disposed inside the lead wire structure layer and away from the base, the second metal layer includes a second lead, and an orthographic projection of the protective layer on the base contains an orthographic projection of the second lead on the base.

In some exemplary embodiments, the light-emitting structure layer includes a plurality of light emitting units, and forming the reflective layer on the protective layer includes:

depositing a reflective film on the protective layer; and
patterning the reflective film to form light-transmitting holes corresponding to the light emitting units and an exposure hole exposing the binding pad, so as to form the reflective layer.

In some exemplary embodiments, the encapsulating structure layer includes a first inorganic encapsulating layer, an organic encapsulating layer and a second inorganic encapsulating layer which are sequentially stacked, and the inorganic encapsulating layer includes the first inorganic encapsulating layer and the second inorganic encapsulating layer which are sequentially stacked, and forming the display structure layer and the binding structure layer in the display region and the binding region respectively includes:

forming the drive structure layer of the display region on the base, and forming the lead wire structure layer and the binding pad of the binding region;

forming the light-emitting structure layer on the drive structure layer;

depositing a first inorganic encapsulating film on the light-emitting structure layer and the lead wire structure layer using a second open mask, so as to form the first inorganic encapsulating layer, in which a second opening exposing the binding pad is provided;

forming the organic encapsulating layer on the first inorganic encapsulating layer; and depositing a second inorganic encapsulating film on the organic encapsulating layer in the display region and the first inorganic encapsulating layer in the binding region using a third open mask, so as to form the second inorganic encapsulating layer, in which a third opening exposing the binding pad is provided.

Based on the inventive concept of the exemplary embodiments described above, an embodiment of the present disclosure further provides a display apparatus including the display substrate in accordance with the embodiments described above. The display apparatus may be a flexible OLED mirror display apparatus. The display apparatus may be any product or component with a display function, such as a mobile phone, a tablet computer, a television, a display, a notebook computer, a digital photo frame, or a navigator.

Although the implementations disclosed in the present disclosure are described as above, the described contents are only implementations which are used in order to facilitate understanding of the present disclosure, and are not intended to limit the present disclosure. Any skilled person in the art to which the present disclosure pertains can make any modifications and alterations in forms and details of implementation without departing from the spirit and scope of the present disclosure. However, the patent protection scope of the present disclosure should be subject to the scope defined by the appended claims.

The invention claimed is:

1. A display substrate comprising a display region and a binding region located on one side of the display region, wherein the display region comprises a display structure layer, a protective layer provided on the display structure layer and a reflective layer provided on the protective layer, and the display structure layer comprises a drive structure layer, a light-emitting structure layer and an encapsulating structure layer stacked on a base;

the binding region comprises a binding structure layer, a protective layer provided on the binding structure layer at one side of the binding region close to the display region, and a reflective layer provided on the protective layer, and the binding structure layer comprises a lead wire structure layer provided on the base, a binding pad provided on the lead wire structure layer and an inorganic encapsulating layer; and the protective layer is formed using a first open mask and a first opening is provided in the protective layer, the first opening being located on one side of the binding region away from the display region and the first opening exposing the binding pad.

2. The display substrate according to claim 1, wherein the lead wire structure layer comprises a second metal layer disposed inside the lead wire structure layer and away from the base, the second metal layer comprises a second lead, and an orthographic projection of the protective layer on the base contains an orthographic projection of the second lead on the base.

3. The display substrate according to claim 2, wherein the light-emitting structure layer comprises a plurality of light emitting units, and light-transmitting holes corresponding to the light emitting units and an exposure hole exposing the binding pad are provided in the reflective layer.

4. The display substrate according to claim 2, wherein an orthographic projection of the protective layer on the base contains orthographic projections of the encapsulating structure layer and the inorganic encapsulating layer on the base.

5. The display substrate according to claim 1, wherein a material of the protective layer comprises any one or more of silicon nitride and silicon oxide.

6. The display substrate according to claim 1, wherein the binding structure layer further comprises an isolation dam disposed on the lead wire structure layer, the isolation dam being wrapped by the inorganic encapsulating layer.

7. A display apparatus comprising the display substrate according to claim 1.

8. A method of manufacturing a display substrate, which comprises a display region and a binding region located on one side of the display region, wherein the method comprises:

forming a display structure layer and a binding structure layer in the display region and the binding region respectively, wherein the display structure layer comprises a drive structure layer, a light-emitting structure layer and an encapsulating structure layer stacked on a base, and the binding structure layer comprises a lead wire structure layer provided on the base, a binding pad provided on the lead wire structure layer and an inorganic encapsulating layer;

forming a protective layer, in which a first opening is provided, using a first open mask, wherein the protective layer overlies the display structure layer in the display region and overlies the binding structure layer at one side of the binding region close to the display region, the first opening is located on one side of the binding region away from the display region, and the first opening exposes the binding pad; and forming a reflective layer on the protective layer.

9. The method of manufacturing a display substrate according to claim 8, wherein the lead wire structure layer comprises a second metal layer disposed inside the lead wire structure layer and away from the base, the second metal layer comprises a second lead, and an orthographic projection of the protective layer on the base contains an orthographic projection of the second lead on the base.

10. The method of manufacturing a display substrate according to claim 9, wherein the light-emitting structure layer comprises a plurality of light emitting units, and forming the reflective layer on the protective layer comprises:

depositing a reflective film on the protective layer; and patterning the reflective film to form light-transmitting holes corresponding to the light emitting units and an exposure hole exposing the binding pad, so as to form the reflective layer.

11. The method of manufacturing a display substrate according to claim 8, wherein the encapsulating structure layer comprises a first inorganic encapsulating layer, an organic encapsulating layer and a second inorganic encapsulating layer which are sequentially stacked, and the inorganic encapsulating layer comprises the first inorganic encapsulating layer and the second inorganic encapsulating layer which are sequentially stacked, and forming the display structure layer and the binding structure layer in the display region and the binding region respectively comprises:

forming the drive structure layer of the display region on the base, and forming the lead wire structure layer and the binding pad of the binding region;

forming the light-emitting structure layer on the drive structure layer;

depositing a first inorganic encapsulating film on the light-emitting structure layer and the lead wire structure layer using a second open mask, so as to form the first inorganic encapsulating layer, in which a second opening exposing the binding pad is provided;

forming the organic encapsulating layer on the first inorganic encapsulating layer; and depositing a second inorganic encapsulating film on the organic encapsulating layer in the display region and the first inorganic encapsulating layer in the binding region using a third open mask, so as to form the second inorganic encapsulating layer, in which a third opening exposing the binding pad is provided.

12. The method according to claim 8, wherein a material of the protective layer comprises any one or more of silicon nitride and silicon oxide.

13. A display apparatus comprising the display substrate according to claim 2.

14. A display apparatus comprising the display substrate according to claim 3.

15. A display apparatus comprising the display substrate according to claim 4.

16. A display apparatus comprising the display substrate according to claim 5.

17. A display apparatus comprising the display substrate according to claim 6.

* * * * *